United States Patent
Onozawa et al.

(10) Patent No.: US 6,316,064 B1
(45) Date of Patent: Nov. 13, 2001

(54) PROCESS OF PRODUCING A RUTHENIUM OR RUTHENIUM OXIDE THIN FILM

(75) Inventors: Kazuhisa Onozawa; Akifumi Masuko; Toshiya Shingen, all of Tokyo (JP)

(73) Assignee: Asahi Denka Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/487,241

(22) Filed: Jan. 20, 2000

(30) Foreign Application Priority Data

Jan. 25, 1999 (JP) .................................................. 11-016114

(51) Int. Cl.$^7$ ....................................................... C23C 8/00
(52) U.S. Cl. .................... 427/585; 427/250; 427/255.31; 427/255.395
(58) Field of Search ..................... 427/585, 250, 427/255.31, 255.395

(56) References Cited

FOREIGN PATENT DOCUMENTS

| | | |
|---|---|---|
| 5-132776 | 5/1993 | (JP) . |
| 6-283438 | 10/1994 | (JP) . |
| 8-186103 | 7/1996 | (JP) . |

OTHER PUBLICATIONS

Yuzo Tasaki et al., "Lowering Melting Points of Ruthenium (III) Complexes as Precursors for Metalorganic Chemical Vapor Deposition", *The Chemical Society of Japan*, vol. 9, 1997, p. 648, (No month avail.).

*Primary Examiner*—Bernard Pianalto
(74) *Attorney, Agent, or Firm*—Young & Thompson

(57) ABSTRACT

A ruthenium or ruthenium oxide thin film produced by CVD using as a ruthenium source a compound represented by formula (I):

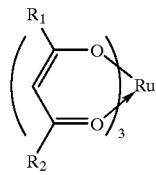

(I)

wherein $R_1$ and $R_2$ represent different alkyl groups having 1 to 4 carbon atoms.

4 Claims, 1 Drawing Sheet

PROCESS OF PRODUCING A RUTHENIUM OR RUTHENIUM OXIDE THIN FILM

BACKGROUND OF THE INVENTION

1. Field of the Invention

The present invention relates to thin film comprising ruthenium, including a ruthenium thin film and a ruthenium oxide thin film (hereinafter inclusively referred to as a ruthenium thin film), formed by chemical vapor deposition (CVD), a ruthenium compound used as a ruthenium source in CVD, and a process for producing the thin film. More particularly, it relates to a ruthenium thin film formed by CVD using a specific organoruthenium complex, a β-diketonatoruthenium useful as a ruthenium source in the CVD, and a process for producing the ruthenium thin film.

2. Description of the Related Art

Ruthenium thin film including a metallic ruthenium thin film and a ruthenium oxide thin film is expected to be applicable as a capacitor electrode of a thin film capacitor comprising a ferroelectric and high-dielectric substance used in memory devices, such as DRAM and FeRAM.

While thin film processing for forming a metallic thin film, a metal oxide thin film, and a complex metal oxide thin film includes sputtering, ion plating, pyrolytic coating, and the like, CVD is appreciated as the most suitable thin film deposition technique for manufacturing a ruthenium electrode for the above-described memory device capacitors from the standpoint of compositional controllability, coating performance on a surface with level differences, and matching with capacitor film production processing.

However, ruthenium compounds that have hitherto been proposed as a ruthenium source in CVD for ruthenium thin film deposition do not necessarily possess sufficient properties. That is, conventional ruthenium compounds for CVD are solid having high melting points and therefore need to be vaporized by sublimation or be maintained at higher temperatures above their melting points and have often given rise to problems in vapor supply and in-line transportation of raw material, such as shortage of vapor supply or variation in vapor supply with time. A solution CVD technique using a solution of a raw material compound in an organic solvent has been proposed in Japanese Patent Application Laid-Open Nos. 132776/93 and 186103/96. However, the solution is not stable enough for practical use because the ruthenium compound disclosed has small solubility in organic solvents, and the solution suffers from precipitation due to change in temperature, partial volatilization of the solvent, change in concentration, and the like.

Ruthenium compounds that have been proposed to date as a ruthenium source for CVD include tri(dipivaloylmethanato)ruthenium (melting point: 215° C.; Japanese Patent Appln. Laid-Open No. 283438/94), and tri(diisobutyrylmethanato)ruthenium (melting point: 117° C.) and tri(isobutyrylpivaloylmethanato)ruthenium (melting point: 134° C.), both of which have a lower melting point than tri(dipivaloylmethanato)ruthenium (Tazaki, et al., Journal of the Chemical Society of Japan, No. 9, p. 648 (1997)), but none of them have furnished solutions to the above-described problems.

SUMMARY OF THE INVENTION

An object of the present invention is to provide a liquid ruthenium compound suitable for CVD, a ruthenium compound which has high and stable solubility in various solvents and is suitable for CVD, a process for producing a ruthenium thin film by CVD using these ruthenium compounds in which the raw material can be supplied stably with high controllability, and a ruthenium thin film formed by the process.

As a result of extensive investigations, the present inventors have found that the above objects are accomplished by using, as a raw material, a specific β-diketonatoruthenium having an asymmetric β-diketone as a ligand.

The present invention provides a ruthenium thin film produced by CVD using as a raw material a compound represented by formula (I):

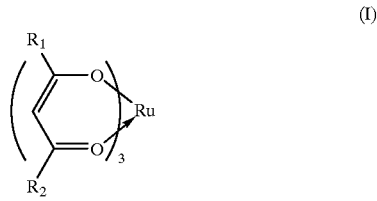

wherein $R_1$ and $R_2$ represent different alkyl groups having 1 to 4 carbon atoms.

The present invention also provides a process for producing a ruthenium thin film which comprises depositing ruthenium or ruthenium oxide on a substrate by chemical vapor growth using the compound represented by formula (I).

The ruthenium thin film of the present invention is obtained by CVD using, as a ruthenium source, a β-diketonatoruthenium having a specific ligand and exhibiting high solubility to provide a stable solution or a liquid β-diketonatoruthenium having a specific ligand. The CVD can be performed with high controllability while supplying the raw material stably. The ruthenium thin film of the present invention is useful as an electrically conductive thin film.

DETAILED DESCRIPTION OF THE INVENTION

Figure 1:
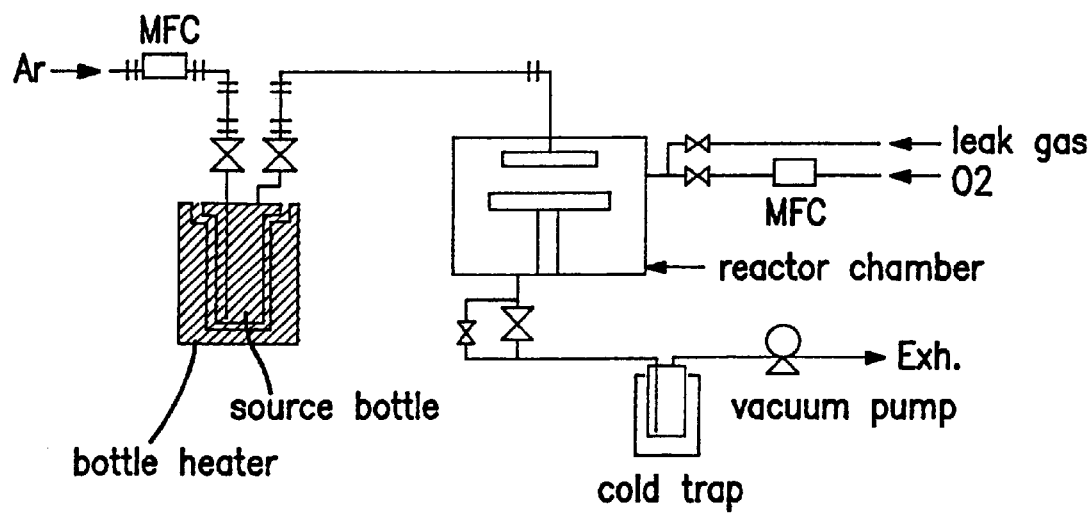
FIG. 1 schematically illustrates a CVD system which can be used in the production of the ruthenium thin film according to the present invention.

The ruthenium thin film of the present invention will be described in detail with reference to its preferred embodiments.

Of the compounds of formula (I), those in which either one of $R_1$ or $R_2$ is a methyl group or a sec-butyl group, and the other one is an alkyl group having 2 to 4 carbon atoms are preferred for their high solubility. The compound of formula (I) wherein $R_1$ is a methyl group, and $R_2$ is an n-butyl group or an isobutyl group is particularly preferred. Specific examples of β-diketone ligand compounds having such alkyl substituents are shown below.

Compound 1

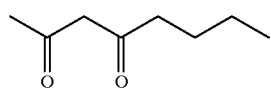

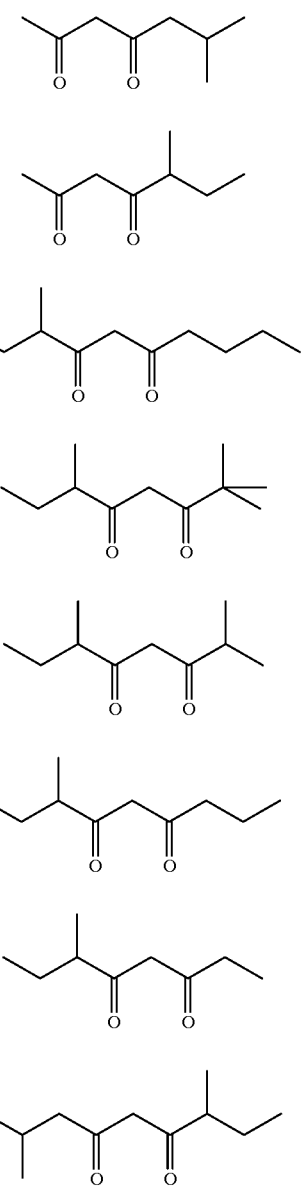

Compound 2
Compound 3
Compound 4
Compound 5
Compound 6
Compound 7
Compound 8
Compound 9

The β-diketone, a ligand compound, can be obtained by conventional condensation reaction between a ketone and a reactive derivative of an organic acid, such as an ester or an acid halide.

The β-diketonatoruthenium of formula (I) which can be used as a CVD raw material in the present invention is obtained by allowing a β-diketone and a ruthenium salt in a known manner. Synthesis Examples for the compound of formula (I) are shown below.

Synthesis Example 1

Synthesis of Tri(octane-2,4-dionato)ruthenium

In a 2000 ml four-necked flask were charged 15.3 g of ruthenium chloride trihydrate, 375 g of water, and 940 g of ethanol, and the mixture was refluxed for 4 hours. After confirming the blue color of the reaction mixture, 27.7 g of compound 1 (octane-2,4-dione) was added thereto, followed by heating under reflux until the reaction mixture assumed a purple color. To the reaction mixture was added 19.3 g of potassium hydrogencarbonate, followed by further refluxing. Refluxing was stopped when the reaction mixture turned red, and the reaction mixture was cooled and filtered to separate the solid. Ethanol was evaporated, and 250 g of toluene was added to the residue. The mixture was washed successively with 50 g of a 5 wt % sodium hydrogencarbonate aqueous solution and then two 150 g portions of water and dried over sodium sulfate. The solution was concentrated to a concentration of 15 wt %. The solution was treated with activated alumina to remove any impurity and filtered. The solvent was removed from the filtrate to give 17.3 g of the title compound as a red liquid.

As a result of IR spectroscopy, the liquid exhibited absorption at wave numbers 2951 $cm^{-1}$, 2897 $cm^{-1}$, 2840 $cm^{-1}$, 1545 $cm^{-1}$, 1510 $cm^{-1}$, and 1400 $cm^{-1}$, which are characteristic of a β-diketonato complex of ruthenium. No peak at 1600 $cm^{-1}$, which is characteristic of a β-diketone, was shown. As a result of inductively coupled plasma-atomic emission spectroscopy (ICP-AES), the ruthenium content of the liquid was 19.24%, which was in good agreement with the theoretical value 19.27%.

Synthesis Example 2

Synthesis of Tri(6-methylheptane-2,4-dionato) ruthenium

In a 500 ml four-necked flask were charged 80.0 g of compound 2 (6-methylheptane-2,4-dione), 10.0 g of ruthenium chloride trihydrate, and 18.0 g of sodium hydrogencarbonate, and the mixture was heated at 160° C. for 20 hours while stirring. After cooling, 100 g of toluene was added, followed by stirring for 30 minutes. The reaction mixture was filtered, and the solvent and the excess 6-methylheptane-2,4-dione were removed by evaporation under reduced pressure. The resulting liquid was distilled under reduced pressure in a glass tube oven to give 7.6 g of the title ruthenium compound as a red liquid.

As a result of IR spectroscopy, the liquid exhibited absorption at wave numbers of 2951 $cm^{-1}$, 2873 $cm^{-1}$, 1548 $cm^{-1}$, 1505 $cm^{-1}$, and 1400 $cm^{-1}$, which are characteristic of a β-diketonatoruthenium complex. No peak at 1600 $cm^{-1}$, which is characteristic of a β-diketone, was shown. As a result of ICP-AES, the ruthenium content of the liquid was 19.30%, which was in good agreement with the theoretical value 19.27%.

Synthesis Example 3

Synthesis of Tri(2,2,6-trimethyloctane-3,5-dionato) ruthenium

In a 2000 ml four-necked flask were charged 15.3 g of ruthenium chloride trihydrate, 375 g of water, and 940 g of ethanol, and the mixture was refluxed for 4 hours. After confining the blue color of the reaction mixture, 36.0 g of compound 5 (2,2,6-trimethyloctane-3,5-dione) was added thereto, followed by heating under reflux until the reaction mixture assumed a purple color. To the reaction mixture was added 19.3 g of potassium hydrogencarbonate, followed by further refluxing. Refluxing was stopped when the reaction mixture turned red. After cooling, ethanol was evaporated, and 250 g of toluene was added to the residue. The solid was filtered, washed successively with 50 g of a 5 wt % sodium hydrogencarbonate aqueous solution and then two 150 g portions of water, and dried over sodium sulfate. The solvent was removed, and the resulting crude crystals were recrystallized from 5 times as heavy n-hexane as the crude crystals to yield 15.4 g of the title ruthenium compound as red crystals.

As a result of IR spectroscopy, the crystals exhibited absorption at wave numbers 2990 cm$^{-1}$, 2950 cm$^{-1}$, 2804 cm$^{-1}$, 1533 cm$^{-1}$, 1524 cm$^{-1}$, and 1400 cm$^{-1}$, which are characteristic of a β-diketonatoruthenium complex. No peak at 1600 cm$^{-1}$, which is characteristic of a β-diketone, was shown. As a result of ICP-AES, the ruthenium content of the crystals was 15.49%, which agreed closely with the theoretical value 15.53%.

The asymmetric β-diketonatoruthenium of formula (I) according to the present invention exhibits high solubility in organic solvents to provide stable solutions and is therefore suitable for solution CVD. Because the β-diketonatoruthenium having compound 1, 2, 3 or 8 as a ligand is liquid at room temperature, it is suited to not only solution CVD but solventless CVD.

Where the ruthenium compound of the present invention is used in solution CVD, the organic solvents which can be used are not particularly limited. Examples of useful solvents include alcohols, such as methanol, ethanol, isopropyl alcohol (hereinafter IPA), and n-butanol; acetic esters, such as ethyl acetate, butyl acetate, and methoxyethyl acetate; ether alcohols, such as ethylene glycol monomethyl ether, ethylene glycol monoethyl ether, ethylene glycol monobutyl ether, and diethylene glycol monomethyl ether; ethers, such as tetrahydrofuran (hereinafter THF), glyme, diglyme, triglyme, and dibutyl ether; ketones, such as methyl butyl ketone, methyl isobutyl ketone, ethyl butyl ketone, dipropyl ketone, dIisobutyl ketone, methyl amyl ketone, cyclohexanone, and methylcyclohexanone; and hydrocarbons, such as hexane, cyclohexane, heptane, octane, toluene, and xylene. The solvent to be used is selected appropriately according to the solubility of the solute, the relationship between a working temperature and the boiling point or ignition point of the solvent, and the like. Of the above-enumerated solvents, ethers such as THF, glyme, and diglyme are preferred for their complex stabilizing effect.

Solubilities (%; at 25° C.) of the β-diketonatorutheniums of the present invention in typical solvents are summarized in Table 1 below.

TABLE 1

| Ligand of Ru Complex | Octane | THF | Diglyme | Methanol | IPA |
|---|---|---|---|---|---|
| Compound 1 | ≧30 | ≧30 | ≧30 | ≧30 | ≧30 |
| Compound 2 | ≧30 | ≧30 | ≧30 | ≧30 | ≧30 |
| Compound 3 | ≧30 | ≧30 | ≧30 | ≧30 | ≧30 |
| Compound 5 | ≧30 | ≧30 | ≧30 | 7.7 | 17.3 |
| Compound 8 | ≧30 | ≧30 | ≧30 | 26.4 | ≧30 |
| Dipivaloyl-methanato (comparison) | 10.5 | 24.2 | 1.0 | <1 | <1 |

It is a practice sometimes followed in the art of CVD (inclusive of solution CVD) to add a nucleophilic reagent to the raw material (metal source) or a solution of the raw material as a stabilizer for the metallic raw material and/or for the solution. In carrying out CVD using the ruthenium compound of the present invention, such a stabilizer can be used if desired although it is not necessarily required because the ruthenium compound of the invention is especially superior in stability. Examples of useful stabilizers include ethylene glycol ethers, such as glyrne, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, and 1,1,4,7,10,10-hexamethyltriethylenetetramine; cyclic polyarnines, such as cyclam and cyclen; β-keto esters, such as methyl acetoacetate, ethyl acetoacetate, and 2-methoxyethyl acetoacetate; and β-diketones, such as acetylacetone, dipivaloylmethane, and compounds 1 to 9 listed above.

The stabilizer can be used in an amount usually of 0.1 to 10 mol, preferably 1 to 4 mol, per mole of the ruthenium compound (I) as a solute.

The process for producing the ruthenium thin film of the present invention is not particularly restricted as far as it is formed by CVD. Any CVD technique that can generally be adopted to CVD systems is employable with no particular restriction, which includes thermal CVD, plasma enhanced CVD, photo assisted CVD, and the like. If desired, a ruthenium or ruthenium oxide thin film formed by CVD may be subjected to annealing.

It is preferred that the ruthenium thin film be produced by chemical vapor growth on a substrate by using the compound of formula (I) in which $R_1$ is a methyl group or a sec-butyl group, and $R_2$ is an alkyl group having 2 to 4 carbon atoms. The substrate includes a silicon wafer, ceramics, and glass.

Chemical vapor growth of ruthenium or ruthenium oxide can be carried out as follows. The raw material compound is vaporized, led to a substrate, and decomposed on the substrate to let ruthenium or ruthenium oxide to growth in thin film. In order to prevent the raw material compound from decomposing while it is vaporized, vaporization is preferably conducted at temperatures below the decomposition temperature under reduced pressure of 100 Torr or less, particularly 50 Torr or less. The substrate is preferably heated beforehand to at least the decomposing temperature of the raw material compound, particularly 250° C. or higher, especially 350° C. or higher.

The ruthenium thin film according to the present invention is useful as a capacitor electrode of thin film capacitors using a ferroelectric and high-dielectric substance used in memory devices, such as DRAM and FeRAM.

The present invention will now be illustrated in greater detail with reference to examples, but it should be understood that the invention is not construed as being limited thereto.

EXAMPLE 1
Production of Ruthenium Thin Film by CVD

Ruthenium thin film was deposited on a silicon wafer by use of a CVD system shown in FIG. 1 under the following conditions.

| | |
|---|---|
| Raw material temperature: | 150° C. |
| Carrier gas: | argon, 90 sccm |
| Reaction pressure: | 4 Torr |
| Reaction temperature: | 350° C. |
| Reaction time: | 10 minutes |

The raw material was A: tri(octane-2,4-dionato) ruthenium (ruthenium complex of compound 1); B: tri(6-methylheptane-2,4-dionato)ruthenium (ruthenium complex of compound 2); C: tri(6-methyloctane-3,5-dionato) ruthenium (ruthenium complex of compound 8) or, for comparison, tri(dipivaloylmethanato)ruthenium. After thin film deposition, the film was subjected to annealing in argon at 500° C. for 10 minutes. The composition of the film was confirmed by X-ray diferactometry. The film thickness was measured with a contact type film thickness meter to obtain the deposition rate (nm/min). The thin film deposition was repeated 10 times, and the change in deposition rate between the first time and the tenth time was obtained. Further, the specific resistivity of the film was measured with a four point probe method before and after the annealing. The results obtained are shown in Table 2 below.

TABLE 2

| Raw Material | Film Thickness (nm) | Deposition Rate (nm/min) | Specific Resistivity ($\mu\Omega$cm) | | Change in Deposition Rate (nm/min) |
|---|---|---|---|---|---|
| | | | Before Annealing | After Annealing | |
| Comparison | 59 | 5.9 | 80 | 56 | 5.9 → 2.1 |
| A | 104 | 10.4 | 82 | 59 | 10.4 → 10.5 |
| B | 96 | 9.6 | 74 | 45 | 9.6 → 9.9 |
| C | 119 | 11.9 | 79 | 51 | 11.9 → 11.4 |

EXAMPLE 2
Production of Ruthenium Oxide Thin Film by CVD

Ruthenium oxide thin film was deposited on a silicon wafer in the same manner as in Example 1, except for additionally supplying 36 sccm of oxygen as an oxidizing gas and changing the carrier gas (argon) flow rate to 54 sccm. After thin film deposition, the film was subjected to annealing in argon at 500° C. for 10 minutes. The composition of the film was confirmed by X-ray difiractometry. The film thickness, the change in deposition rate with time, and the specific resistivity of the film were measured in the same manner as in Example 1. The results obtained are shown in Table 3.

EXAMPLE 3
Production of Ruthenium Thin Film by Solution CVD

Figure 2:
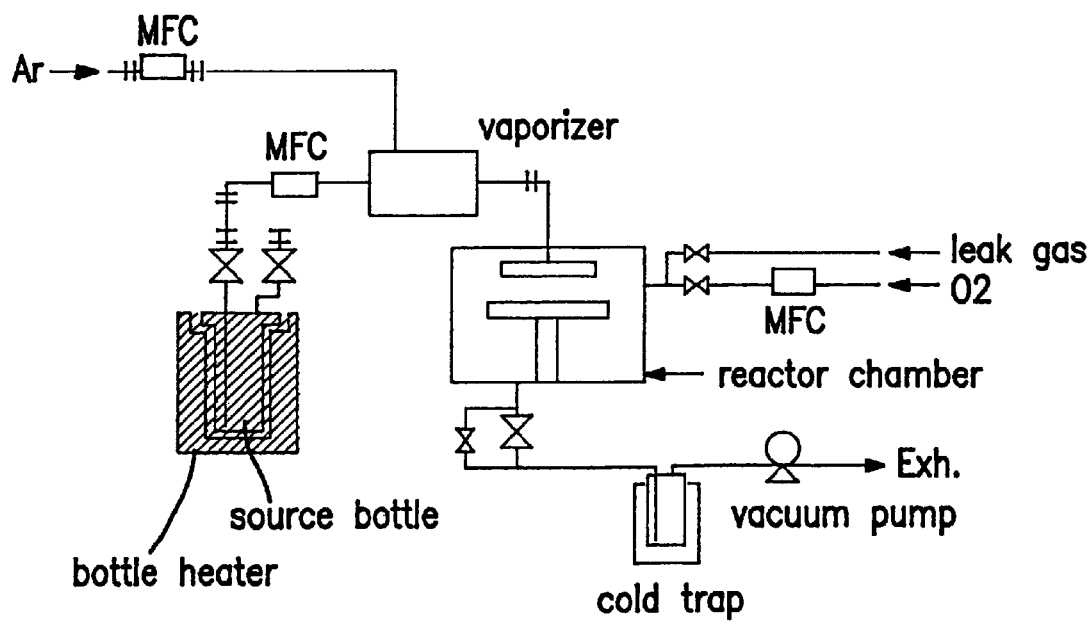
FIG. 2 schematically shows another CVD system which can be used in the production of the ruthenium thin film according to the present invention.

Ruthenium thin film was deposited on a silicon wafer by use of a CVD system shown in FIG. 2 under the following conditions.

| | |
|---|---|
| Vaporization chamber temperature: | 200° C. |
| Raw material flow rate: | 0.05 ml/min |
| Carrier gas: | argon, 90 sccm |
| Reaction pressure: | 8 Torr |
| Reaction temperature: | 350° C. |
| Reaction time: | 5 minutes |

The raw material was D: a 0.2 mol/l THF solution of tri(6-methylheptane-2,4-dionato)ruthenium (ruthenium complex of compound 2); E: 0.2 mol/l THF solution of tri(2,2,6-trimethyloctane-3,5-dionato)ruthenium (ruthenium complex of compound 5); F: 0.2 mol/l THF solution of tri(3-methylnonane-4,6-dionato)ruthenium (ruthenium complex of compound 7) or, for comparison, 0.2 mol/l THF solution of tri(dipivaloylmethanato)ruthenium. After thin film deposition, the film was subjected to annealing in argon at 500° C. for 10 minutes. The composition of the film was confirmed by X-ray diffractometry. The film thickness, the change in deposition rate with time, and the specific resistivity of the film were measured in the same manner as in Example 1. The results obtained are shown in Table 4.

TABLE 3

| Raw Material | Film Thickness (nm) | Deposition Rate (nm/min) | Specific Resistivity ($\mu\Omega$cm) | | Change in Deposition Rate (nm/min) |
|---|---|---|---|---|---|
| | | | Before Annealing | After Annealing | |
| Comparison | 67 | 6.7 | 111 | 77 | 6.7 → 2.9 |
| A | 99 | 9.9 | 93 | 74 | 9.9 → 9.4 |
| B | 110 | 11.0 | 103 | 78 | 11.0 → 11.4 |
| C | 103 | 10.3 | 96 | 71 | 10.3 → 10.1 |

TABLE 4

| Raw Material | Film Thickness (nm) | Deposition Rate (nm/min) | Specific Resistivity (μΩcm) Before Annealing | After Annealing | Change in Deposition Rate (nm/min) |
|---|---|---|---|---|---|
| Comparison | 107 | 21.4 | 88 | 62 | 21.4 → 8.7 |
| D | 108 | 21.6 | 79 | 61 | 21.6 → 20.5 |
| E | 104 | 20.8 | 88 | 59 | 20.8 → 19.1 |
| F | 102 | 20.4 | 73 | 55 | 20.4 → 20.6 |

EXAMPLE 4

Production of Ruthenium Oxide Thin Film by Solution CVD

Ruthenium oxide thin film was deposited on a silicon wafer in the same manner as in Example 3, except for additionally supplying 36 sccm of oxygen as an oxidizing gas and changing the carrier gas (argon) flow rate to 54 sccm and the reaction time to 4 minutes. The raw material was G: a 0.2 mol/l diglyme solution of tri(octane-2,4-dionato) ruthenium (ruthenium complex of compound 1); H: 0.2 mol/l diglyme solution of tri(6-methylheptane-2,4-dionato) ruthenium (ruthenium complex of compound 2); or I: 0.2 mol/l diglyme solution of tri(2,2,6-trimethyloctane-3,5-dionato)ruthenium (ruthenium complex of compound 5). After thin film deposition, the film was subjected to annealing in oxygen at 500° C. for 10 minutes. The composition of the film was confirmed by X-ray diffractometry. The film thickness, the change in deposition rate with time, and the specific resistivity of the film were measured in the same manner as in Example 1. The results obtained are shown in Table 5.

TABLE 5

| Raw Material | Film Thickness (nm) | Deposition Rate (nm/min) | Specific Resistivity (μΩcm) Before Annealing | After Annealing | Change in Deposition Rate (nm/min) |
|---|---|---|---|---|---|
| G | 104 | 26.0 | 98 | 69 | 26.0 → 25.5 |
| H | 111 | 27.8 | 106 | 74 | 27.8 → 27.1 |
| I | 100 | 25.0 | 102 | 77 | 25.0 → 26.2 |

What is claimed is:

1. A process for producing a ruthenium or ruthenium oxide thin film which comprises depositing ruthenium or ruthenium oxide on a substrate by chemical vapor growth using a compound represented by formula (I):

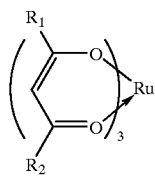

wherein $R_1$ and $R_2$ represent different alkyl groups having 1 to 4 carbon atoms.

2. A process according to claim 1, wherein $R_1$ is a methyl group or a sec-butyl group, and $R_2$ is an alkyl group having 2 to 4 carbon atoms.

3. A process according to claim 1, wherein $R_1$ is a methyl group, and $R_2$ is an n-butyl group.

4. A process according to claim 1, wherein $R_1$ is a methyl group, and $R_2$ is an isobutyl group.

* * * * *